(12) United States Patent
Liaw

(10) Patent No.: US 8,759,180 B2
(45) Date of Patent: Jun. 24, 2014

(54) METHODS FOR FABRICATING STEP GATE ELECTRODE STRUCTURES FOR FIELD-EFFECT TRANSISTORS

(75) Inventor: Jhon Jhy Liaw, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 12/945,047

(22) Filed: Nov. 12, 2010

(65) Prior Publication Data
US 2011/0059604 A1    Mar. 10, 2011

Related U.S. Application Data (62) Division of application No. 10/851,872, filed on May 21, 2004, now Pat. No. 7,851,868.

(51) Int. Cl.
*H01L 29/66* (2006.01)
(52) U.S. Cl.
USPC .................................. 438/275; 257/E21.635
(58) Field of Classification Search
USPC .................. 438/157, 221, 275, 283, 223; 257/E21.635
See application file for complete search history.

(56) References Cited

U.S. PATENT DOCUMENTS

| | | | |
|---|---|---|---|
| 4,466,176 A | | 8/1984 | Temple |
| 5,183,773 A | | 2/1993 | Miyata |
| 5,278,085 A | * | 1/1994 | Maddox et al. ............... 438/224 |
| 5,851,889 A | | 12/1998 | Michael et al. |
| 6,049,113 A | | 4/2000 | Shida |
| 6,166,413 A | | 12/2000 | Ono |
| 6,555,437 B1 | | 4/2003 | Yu |

* cited by examiner

*Primary Examiner* — Amar Movva
(74) *Attorney, Agent, or Firm* — Duane Morris LLP (57) ABSTRACT

A method is disclosed for forming at least two semiconductor devices with different gate electrode thicknesses. After forming a gate dielectric region, and determining whether a first or second device formed on the gate dielectric region expects a relatively faster gate dopant diffusion rate, a gate electrode layer is formed on the gate dielectric region wherein the gate electrode layer has a step-structure in which a portion thereof for the first device has a relatively larger thickness than that for the second device if the first device has a relatively faster gate dopant diffusion rate.

22 Claims, 6 Drawing Sheets

METHODS FOR FABRICATING STEP GATE ELECTRODE STRUCTURES FOR FIELD-EFFECT TRANSISTORS

RELATED APPLICATION

This application is a divisional application of U.S. patent application Ser. No. 10/851,872, filed on May 21, 2004, the contents of which are hereby incorporated by reference as if set forth in their entirety.

BACKGROUND

The present disclosure relates generally to semiconductor device manufacturing, and more particularly to the fabrication of the gate electrodes of field-effect transistors used within integrated circuits.

Very large scale integrated (VLSI) circuits using field effect transistors (FETs) commonly feature complimentary metal oxide silicon (CMOS) semiconductor components used within the circuits. Such CMOS circuits often require complimentary transistors, n-channel (NMOS) and p-channel (PMOS) type transistors located adjacent or in very close proximity to each other. These transistor types, NMOS and PMOS CMOS devices, are typically constructed with gate regions comprising a first layer containing a gate dielectric material such as silicon dioxide ($SiO_2$). A second layer, the gate electrode, is located directly on the top of the first, typically comprised of doped silicon, such as poly-crystalline (poly) or amorphous silicon. The gate electrode, serves as a conducting electrode to the gate dielectric of the transistor. The doped silicon material of the gate electrode is often silicided with a metal film during subsequent device fabrication steps, to lower and improve the resistance of the transistors' gate connections.

Figure 1A:
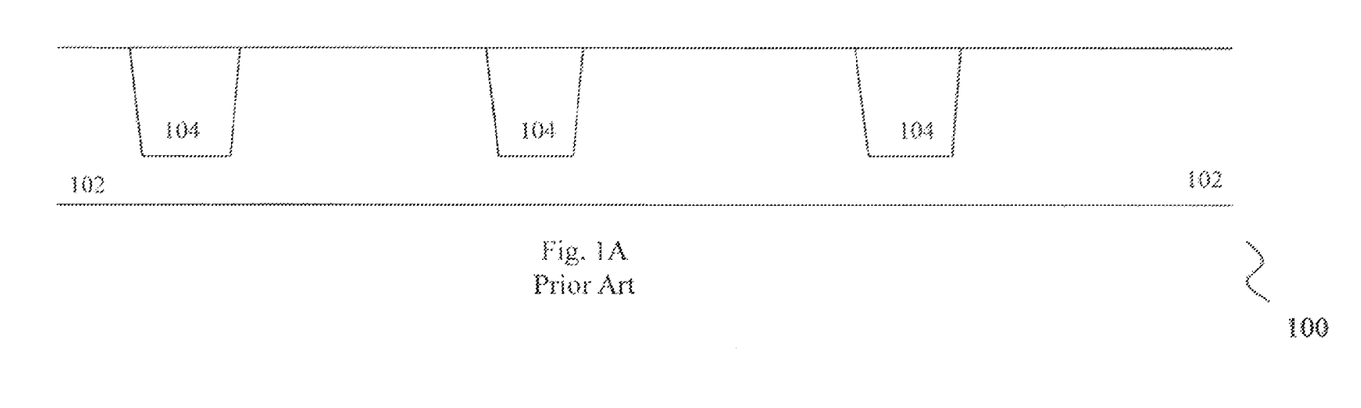
FIGS. 1A through 1D are cross-sectional views illustrating the typical process steps for the fabrication of the gate regions of CMOS transistors.
Figure 1B:
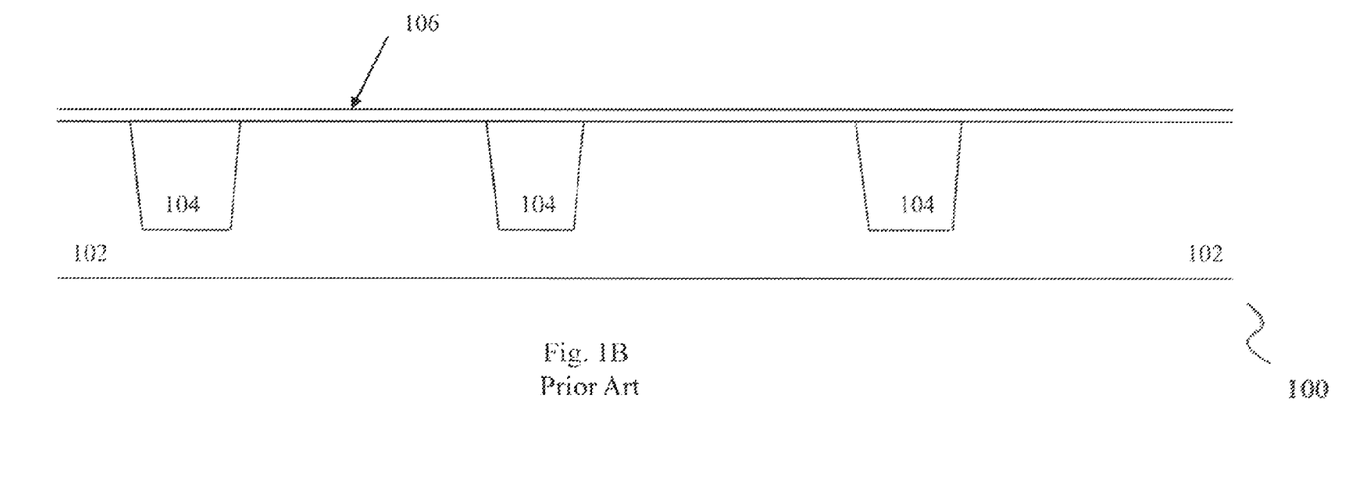
Figure 1C:
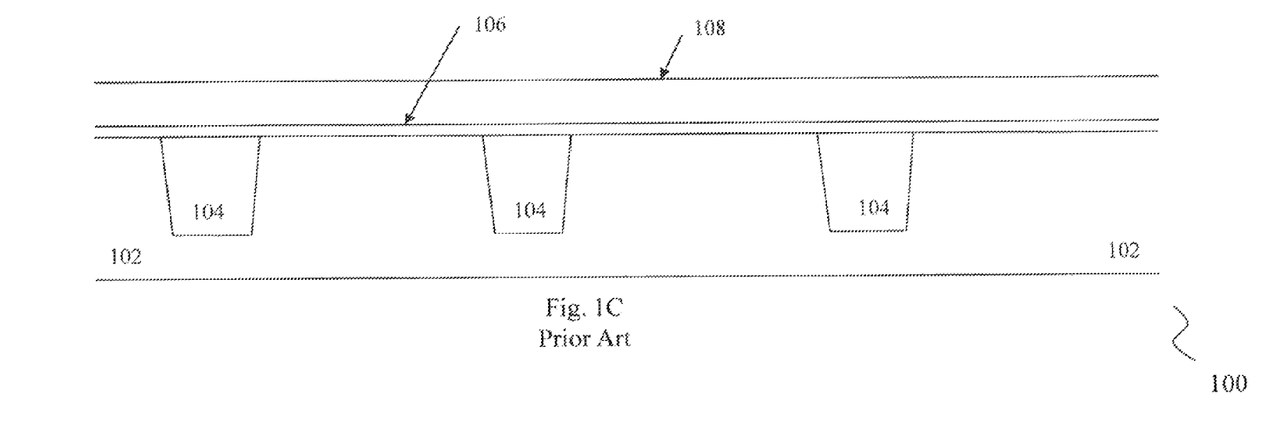
Figure 1D:
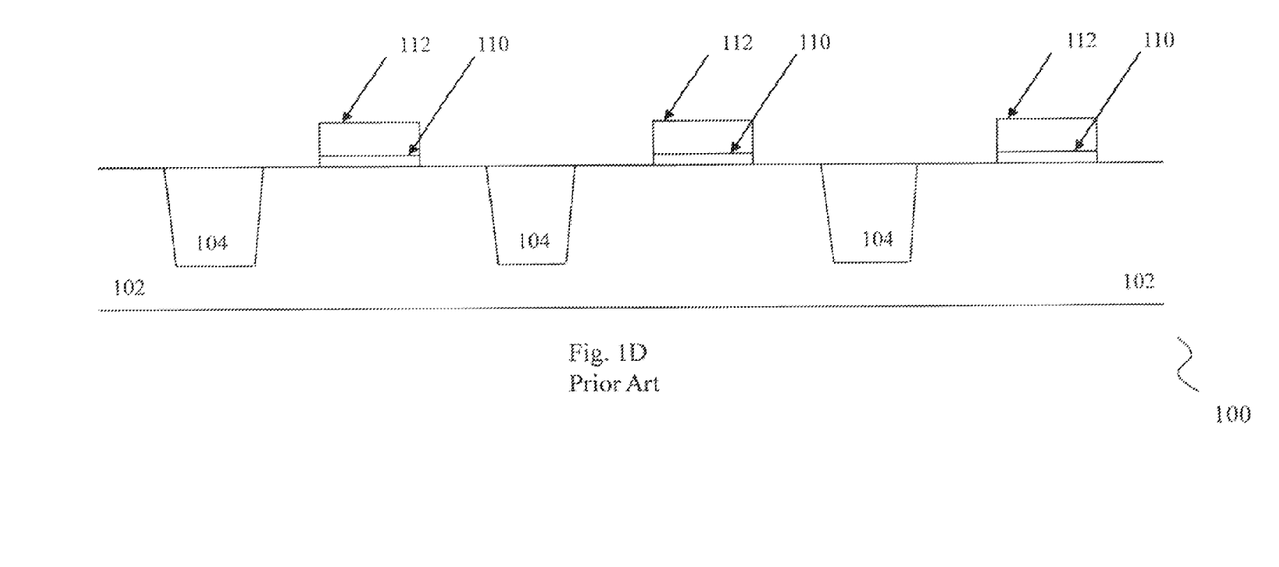

The gate dielectric and electrode layers of both, NMOS and PMOS CMOS transistors are typically fabricated concurrently utilizing the same manufacturing process steps. The concurrent fabrication processes produce gate structures of similar material and thicknesses for the two transistor types. FIGS. 1A through 1D illustrate the typical process steps for the fabrication of the gate regions of CMOS transistors. FIG. 1A is a cross-sectional view of a silicon wafer substrate 100 after the fabrication of isolation structures upon the wafer. The silicon substrate 102 is shown with shallow trench isolation (STI) structures 104 fabricated into the wafer. The STI structures 104 function to electrically isolate individual or small groups of transistors from other individual or small groups of transistors. It is noted that these small groups of transistors may include a mix of both NMOS and PMOS transistors. The first layer of the gate region, the gate dielectric 106 is shown in FIG. 1B, having been grown on top of the silicon wafer substrate 100. The thickness of the gate dielectric 106, as grown, is very uniform and consistent throughout its area of growth. FIG. 1C shows the second gate layer, the gate electrode layer 108 after it's deposition on top of the gate dielectric layer 106. The deposited gate electrode layer 108 is also very uniform and consistent in thickness. The grown gate dielectric 106 and the deposited gate electrode layer 108 are subsequently patterned via photolithography and etched to create individual transistor gates. FIG. 1D illustrates the fabricated transistor gates after the photolithography pattern, etch and photoresist removal operations. There are individual transistor gates, each with their own separate gate dielectric layer 110 and gate electrode layer 112. It is noted that the thickness of the newly formed gate dielectric 110 and gate electrode 112 layers are approximately the same for all of the transistor gates.

The fact that the NMOS and PMOS transistors feature gate dielectric and electrodes thicknesses that are similar imposes some issues and difficulties for tuning and setting the transistors' electrical performances. Each transistor type, NMOS and PMOS, are transistors of different doping types, featuring different dopant type (n-type versus p-type) ions placed within their electrical transistor channels, under the gate dielectric. The different types of dopant ions exhibit differing property behaviors. One such behavior is the thermal diffusion coefficient, the property of thermally-induced dopant diffusion, or movement through the solid in which they are incorporated. Device and process designers may accommodate for the dopant diffusion differences by such techniques as adjusting the sizing of the individual transistors, in addition to adjusting the initial dopant levels and placements as they are incorporated. These transistor sizing and initial dopant-setting techniques are devised such that subsequent thermal operations induced upon the transistors allow the dopants to move and settle upon the desired, final levels and positions at the completion of the device fabrication processes.

The issues with dopant movement within the gate electrodes are more difficult to resolve. Dopant movement induced by the thermal processes may be tolerated by one transistor type while causing detrimental effects to the other. Specifically, these transistor issues may include dopant penetration, dopant depletion, and dopant inter-diffusion.

Dopant penetration occurs when dopants placed into the conducting gate electrode layer diffuses through the underlying gate oxide dielectric layer of the gate electrode to the transistor electrical channel of the semiconductor substrate. Such penetration may occur during the thermal operations for the semiconductor substrate wafers after the gate regions have already been fabricated. Such thermal processes may apply dopant diffusion temperatures between 400 and 1200 degrees Celsius. In addition, the transistors used within the advanced device and process technologies are even more susceptible to the dopant penetration issue. Such advanced transistors may have physical gate lengths of 65 nm or less and thin gate dielectric layers with 20 angstrom or less in thickness. The issue of dopant penetration may be lessened with a thicker gate electrode layer above the gate dielectric. Thicker gate electrode may allow the moving dopants to stay more within the layer, rather than penetrating thru the gate dielectric. However, for other design considerations, and the concerns with dopant depletion within the gate electrode layer, merely increasing gate electrode thickness may not be compatible or practical to implement.

Dopant depletion occurs when dopants placed into the gate conducting gate electrode are insufficiently distributed within the entire depth (thickness) of the layer. As result, there is a region of the gate poly-silicon electrode which is depleted of the desired dopant, enough to alter the desired electrical performance of the transistor. Subsequent post-gate thermal processes may not be sufficient to uniformly redistribute the non-uniform dopant. Post-gate thermal processes may even cause evenly distributed dopants to move enough to create a depleted region within the gate electrode layer. This issue of dopant depletion may be minimized or eliminated if the gate electrode used thickness was accommodating for the amount or dopant movement within the gate electrode layer. The gate electrode layer must be thick enough to minimize the previously discussed dopant penetration issue, while not being too thick to allow dopant depletion within the layer.

Dopant inter-diffusion relates to the cross-contamination of the transistor dopants between NMOS and PMOS transistors. The n-type dopants of the NMOS transistor may diffuse into the p-type doped areas and/or electrical channel of a PMOS transistor as well as the diffusion of p-type dopants into the n-type areas and/or electrical channel of an NMOS transistor. The issue of dopant inter-diffusion is strongly influenced by the proximities, and diffusion paths and distances between the opposing dopant regions. This issue of dopant inter-diffusion restricts and constrains the allowed thermal budgets applied upon the fabricated gate regions.

As new device and process technologies advance, transistor gates become geometrically smaller and thinner in size. The issues and problems associated with the dopant distribution and cross-contamination become more important as well as more difficult to overcome.

What is desired is an improved method for the fabrication of transistor gate regions such that the issues related to dopant distribution and cross-contamination are appropriately dealt with.

SUMMARY

In view of the foregoing, the present invention provides a method for forming at least two semiconductor devices with different gate electrode thicknesses. In one embodiment, after forming a gate dielectric region, and determining whether a first or second device formed on the gate dielectric region expects a relatively faster gate dopant diffusion rate, a gate electrode layer is formed on the gate dielectric region wherein the gate electrode layer has a step-structure in which a portion thereof for the first device has a relatively larger thickness than that for the second device if the first device has a relatively faster gate dopant diffusion rate.

The construction and method of operation of the invention, however, together with additional objects and advantages thereof will be best understood from the following description of specific embodiments when read in connection with the accompanying drawings.

DESCRIPTION

The present disclosure describes an improved method for the fabrication of CMOS transistor gate regions. The disclosed method provides a stepped gate electrode thicknesses such that transistors of different gate electrode thicknesses may be fabricated. The flexibility of fabricating transistors with different gate electrode thicknesses allows the device and process designers to design and create CMOS transistors such that the dopant related issues such as dopant penetration, dopant depletion and dopant contamination may be greatly minimized and/or eliminated. The improved method lessen the sensitivity of the transistors to thermal processes thus allowing greater flexibilities to the thermal budgets within the process designs as well as to physical dimensional aspects of the transistor sizes.

Figure 2A:
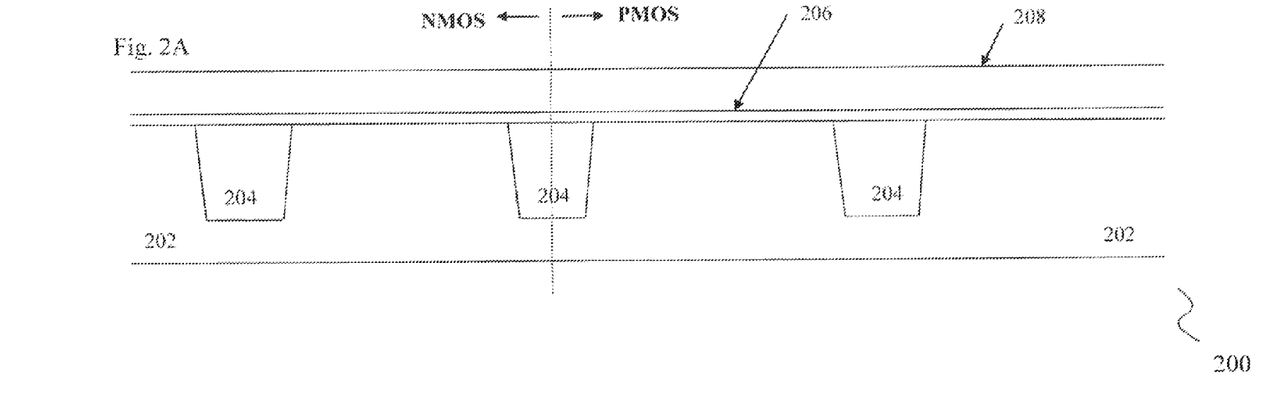
FIGS. 2A through 2C are cross-sectional views illustrating the process steps for fabrication of the first disclosed embodiment of stepped gate regions of CMOS transistors for the present disclosure.
Figure 2B:
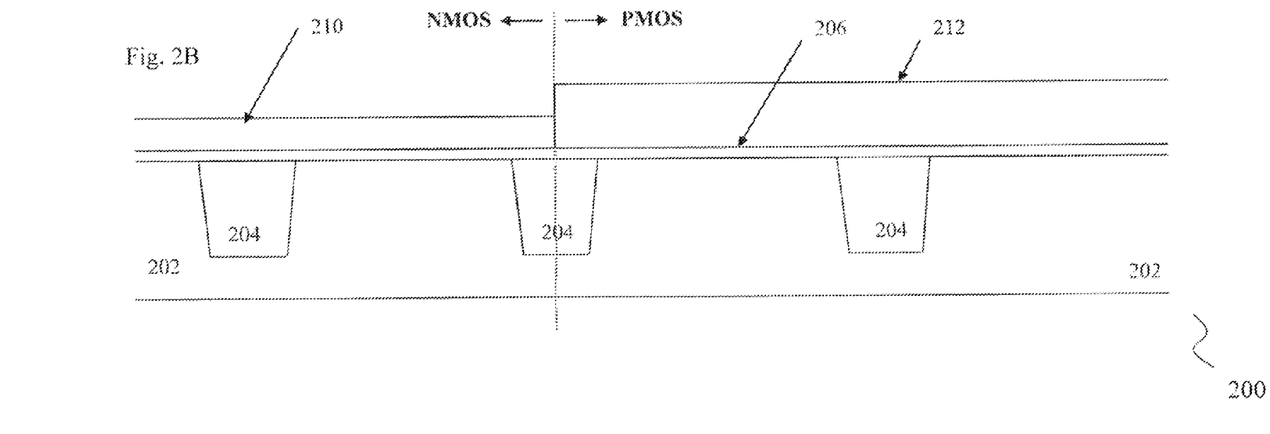
Figure 2C:
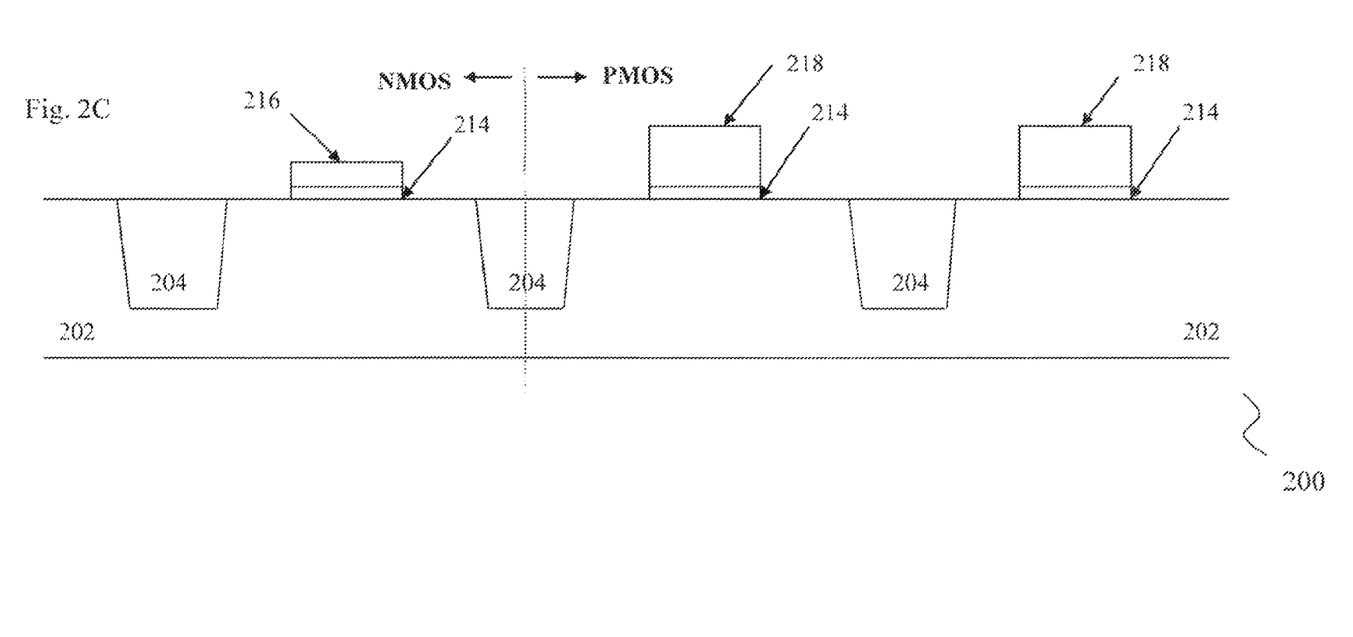

FIGS. 2A through 2C illustrate the process steps for the fabrication of the gate regions of CMOS transistors for one embodiment of the present disclosure. FIG. 2A is a cross-sectional view of a silicon wafer substrate 200 after the fabrication of isolation structures upon the wafer. The silicon substrate 202 is shown with silicon trench isolation (STI) structures 204 fabricated into the wafer. The first layer of the gate region, the gate dielectric 206 is shown in FIG. 2A, having been grown on top of the silicon wafer substrate 200. The gate dielectric material may include materials such as $SiO_2$, $Si_3N_4$, SiON, $Al_2O_3$, $Ta_2O_5$, or HfO. In some other situations, the gate dielectric material can be high K material with its K value larger than 5. The thickness of this gate dielectric layer 206 may be approximately 20 or less angstroms. The gate dielectric 206, as grown, is very uniform and consistent throughout its area of growth. FIG. 2A also shows the second gate layer, the gate electrode layer 208 after it's deposition on top of the gate dielectric layer 206. The thickness of the gate electrode layer 208 may be of any thickness up to approximately 2400 angstroms. In some situations, it is less than 1500, or even 1100 angstroms. The deposited gate electrode layer 208 is also very uniform and consistent in thickness. The gate electrode material can be doped-poly containing gate materials, silicide containing materials, or metal containing materials such as doped-poly, silicide and doped poly, metal and doped poly, silicide only, or metal only gate materials.

There is a vertical dotted line to mark the wafer substrate 200 to show that NMOS transistors will be located on the section left of the dotted line, and that PMOS transistors will be located on the section right of the dotted line. At least one conventional photolithography pattern and etch step sequence is subsequently preformed to selectively etch a portion of the gate electrode layer 208 thickness of the transistors. It is also noted the etch process is a conventional type process used for the etching of silicon layers (poly-crystalline or amorphous). For this disclosed embodiment, the additional gate electrode pattern and etch sequences are applied only to the section of the wafer substrate 200 designated for the NMOS transistors. FIG. 2B shows the cross-sectional view after the patterning and etching of the gate electrode layer 208 at the selected NMOS transistor areas. The etched NMOS gate electrode layer 210 is shown as the second set of transistor gate electrodes having a step height lower than that of the PMOS non-etch gate electrode layer 212. The step height difference or thickness difference may be between 10 to 2000 angstroms. In some situation, the step height difference is kept under 500 or 300 angstroms. It is also noticed that the physical gate length of the transistors may be 65 nm or less.

FIG. 2C shows the transistor gate regions after completion of the next set of photolithography pattern and etch steps that isolates and creates the gate dielectric and gate electrode for each individual transistor. There is one NMOS transistor with a gate dielectric layer 214 and a gate electrode layer 216. There are two PMOS transistors with a gate dielectric layer 214 and a gate electrode layer 218. The gate dielectric layers of the three described transistors, 214 are of approximately the same thickness (height). The gate electrode layer 216 of the NMOS transistor is a step height shorter (thinner) than that of the gate electrode layers 218 of the two PMOS transistors. It is noted that there may be more than one set of photolithography pattern and etch steps used to complete the final gate regions of the NMOS and PMOS transistors.

In this disclosed embodiment, the gate electrodes of all NMOS transistors are fabricated with a step height lower (thinner) than that of the PMOS transistors. The thickness difference for the gate electrodes between the two transistor types accommodate for the dopant diffusion and behaviors differences such as the conduction rate difference due to the differing types of dopants incorporated into each transistor type, NMOS and PMOS. The relatively thicker gate electrode is used for a transistor that has a relatively faster dopant diffusion rate or faster conduction rate. The gate electrode thicknesses selectively fabricated for each transistor type are thick enough to minimize/eliminate dopant penetration issues for each type and not too thick such that dopant depletion may easily occur. The step difference between the gate electrodes of the opposing transistor types, NMOS and PMOS, also functions to help restrict the diffusion paths of dopants such that dopant inter-diffusion, cross-contamination from one dopant type region into another, is greatly lessened.

After the completion of the last set of photolithography pattern and etch steps to define the individual gate regions of both NMOS and PMOS transistors, the semiconductor wafer substrate 200 may then resume normal, conventional processing to complete the CMOS integrated circuit device fabrication, including the standard thermal processes. It is noted that the disclosed step gate electrodes are compatible which all conventional metal gate silicide/salicide processes by which the gate electrode is reacted with metal films to lower and improve the resistance of the transistors' gate connections. These silicided/salicide processes may utilize metal films such as W (tungsten), WSi (tungsten silicide), Ti (titanium), TiN (titanium nitride), TaN (tantalum nitride) and Al (aluminum). Other materials that may be contained in the gate electrode are $TiSi_2$, Co, $CoSi_2$, Ni, NiSi, Pt, and/or PtSi.

Figure 3A:
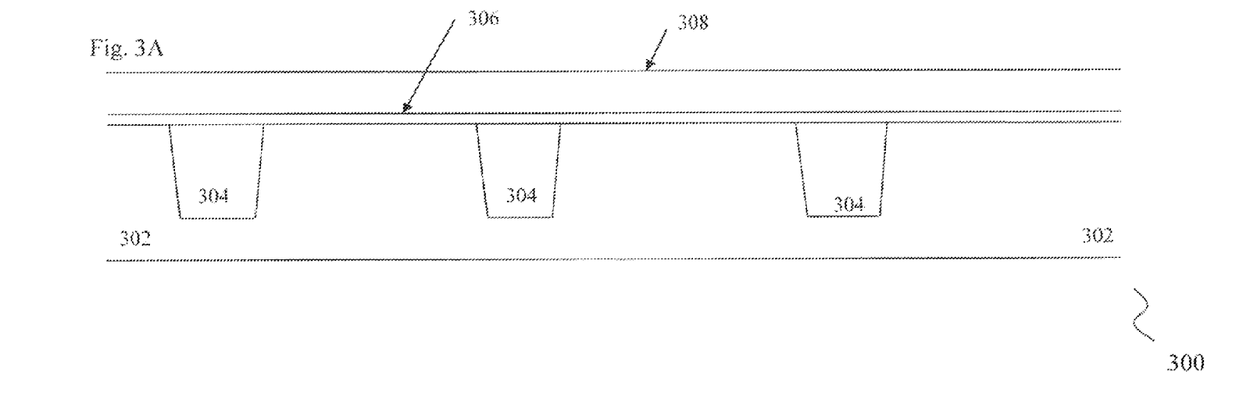
FIGS. 3A through 3C are cross-sectional views illustrating the process steps for fabrication of the second disclosed embodiment of stepped gate regions of CMOS transistors for the present disclosure.
Figure 3B:
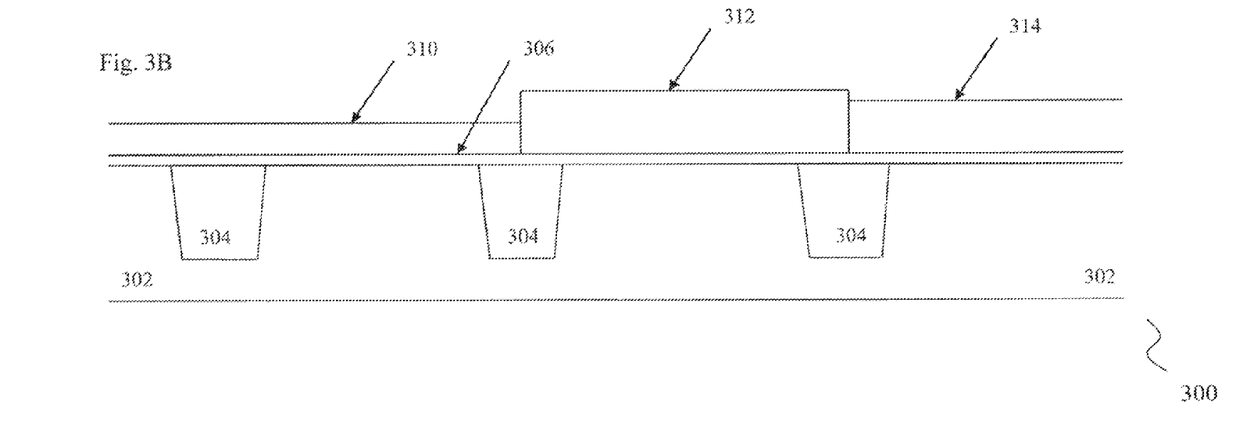
Figure 3C:
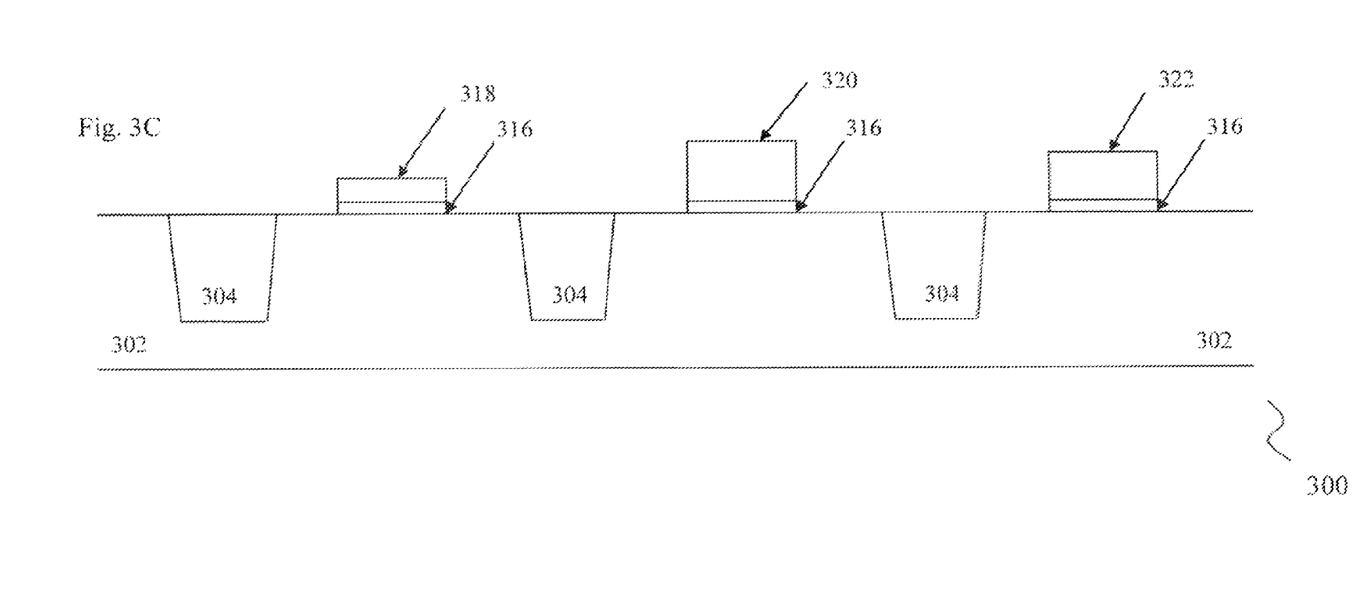

FIGS. 3A through 3C illustrate the process steps for the fabrication of the gate regions of CMOS transistors for another embodiment of the present disclosure. FIG. 3A is a cross-sectional view of a silicon wafer substrate 300 after the fabrication of isolation structures upon the wafer. The silicon substrate 302 is shown with silicon trench isolation (STI) structures 304 fabricated into the wafer. The first layer of the gate region is the gate dielectric 306 having been grown on top of the silicon wafer substrate 300. The gate dielectric 306, as grown, is very uniform and consistent throughout its area of growth. FIG. 3A also shows the second gate layer, the gate electrode layer 308, after it's deposition on top of the gate dielectric layer 306. The deposited gate electrode layer 308 is also very uniform and consistent in thickness.

Multiple sets of photolithography pattern and etch process steps are subsequently performed to selectively etch thickness portions of the gate electrode layer 308 of the transistors. As discussed for the description of the first disclosed embodiment, the etch process is a conventional type process used for the etching of silicon layers (poly-crystalline or amorphous). For this disclosed embodiment, the additional gate electrode pattern and etch sequences are applied to sections of the wafer substrate 300 to create gate electrodes of three different step heights (thicknesses). FIG. 3B shows the cross-sectional view after the patterning and etching of the gate electrode layer 308 to create three different gate electrode regions. The left-most gate region 310 is the thinnest (shortest). The adjacent gate electrode region 312 is the thickest (tallest) and the right-most gate electrode region 314 has a thickness in-between the thinnest gate electrode region 310 and the thickest gate electrode region 312. These three gate electrode regions of different step heights (thickness) correspond to the areas where transistors of three different gate steps will be fabricated.

FIG. 3C shows the transistor gate regions after completion of the next set of photolithography pattern and etch steps that isolate and create the gate dielectric and gate electrode for each individual transistor. There are three transistors shown, each having a gate dielectric layer 316 of approximately similar thickness. Each of the three transistors has a gate electrode layer of a step height (thickness) different than that of the other two transistors. The left-most transistor has a gate dielectric layer 316 and a gate electrode layer 318. The adjacent transistor has a gate dielectric layer 316 and a gate electrode layer 320 that has a higher gate step (thickness) than the gate electrode layer 318 of the left-most transistor. The right-most transistor features a gate dielectric layer 316 and a gate electrode layer 322 with a gate step (thickness) that is in-between that of the left-most transistor and the transistor that is located adjacent to it. It is noted again that there may be more than one set of photolithography pattern and etch steps used to complete the final gate regions of the three types of step transistors.

In this second disclosed embodiment, there are three type of gate electrodes fabricated, featuring three stepped gate electrode thicknesses (height). These thickness differences for the gate electrodes between the transistors demonstrate the flexibility of the disclosed transistor gate fabrication method to be used to accommodate for the a large variety of dopant diffusion behaviors and differences due to any physical dimensional aspects of the transistors, transistor circuits layouts or any material and/or processing phenomena. The gate electrode thicknesses fabricated for each transistor could be designed and selected such that the gate step (thickness, height) is sufficient to minimize/eliminate the occurrence of both the dopant penetration and dopant depletion issues. The step structure of the gate electrodes again serves to help restrict the diffusion paths of dopants such that dopant inter-diffusion, cross-contamination from one dopant type region into another, is greatly lessened.

After the completion of the last set of photolithography pattern and etch steps to define the individual gate regions of the transistors, the semiconductor wafer substrate 300 may then resume normal, conventional processing to complete the CMOS integrated circuit device fabrication.

The disclosed method of using stepped gate electrode thickness provides an effective means for minimizing and elimination of dopant related issues associated with the conventional fabrication of CMOS devices. The fabrication of transistors featuring different gate electrode steps (thickness, height) allows for the device and process designers to better address the issues of dopant penetration, dopant depletion and dopant inter-diffusion. The designed and selected gate steps for each transistor allows for more precise tuning and setting of transistors such that dopant penetration issues are thoroughly addressed without compromising the resolutions for dopant depletion. The step differences established between transistors of opposing types help restrict the diffusion paths of any cross-contaminating dopants such that dopant inter-diffusion, cross-contamination from one dopant type region into another, is greatly lessened. The step gate method of the present disclosure also lessens the sensitivity of the transistors to thermal processes thus allowing greater flexibilities to the thermal budgets within the process designs as well as to physical dimensional aspects of the transistor sizes.

The present disclosure describes several embodiments to illustrate the flexibility of how the disclosed step gate method may be implemented. The disclosed step gate method may be implemented for present and future device and process technologies. The disclosed method will become especially valuable as new device and process technologies continue to advance, with transistor gates becoming geometrically smaller and thinner in size. The additional photolithography and etch Operations used to create the gate steps are conventional processes already available and in use within conventional fabrication facilities.

The above disclosure describes many different embodiments or embodiments for implementing different features of the disclosure. Specific embodiments of components and processes are described to help clarify the invention. These are, of course, merely embodiments and are not intended to limit the invention from that described in the claims.

Although the present invention is illustrated and described herein as embodied in a design and method for fabricating gate structure with different thicknesses, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A method for forming at least two semiconductor devices comprising:
   forming a gate dielectric region;
   determining that a first device formed on the gate dielectric region has a relatively faster gate dopant diffusion rate than a second device formed on the gate dielectric region;
   forming a doped gate electrode layer on the gate dielectric region, wherein forming the doped gate electrode layer includes doping the first and second devices with predetermined dopants in first and second device portions, respectively; and
   forming a step-structure in the doped gate electrode layer in which the first device portion has a relatively larger thickness than the second device portion.

2. The method of claim 1 wherein the forming a step-structure in the doped gate electrode layer includes:
   patterning a photoresist layer to cover the first device portion;
   reducing the uncovered doped gate electrode layer to a predetermined thickness; and
   removing the photoresist layer.

3. The method of claim 1, wherein the first device portion is doped with a predetermined dopant that has a relatively faster diffusion rate than the predetermined dopant for the second device portion.

4. The method of claim 1 wherein a thickness difference of the doped gate electrode layer between the first and second device portions is at least 10 angstroms.

5. The method of claim 1 wherein a thickness difference of the doped gate electrode layer between the first and second device portions is less than 2000 angstroms.

6. The method of claim 5 wherein the thickness difference of the doped gate electrode layer between the first and second device portions is less than 500 angstroms.

7. The method of claim 1 wherein the relatively larger thickness of the doped gate electrode layer is less than 1100 angstroms.

8. The method of claim 1 further comprising metalizing the doped gate electrode layer.

9. The method of claim 1 wherein the doped gate electrode layer further comprises W, WSi, Ti, TiSi2, Co, CoSi2, Ni, NiSi, Pt, PtSi, TiN, TaN or Al.

10. The method of claim 1 wherein the gate dielectric region includes a gate dielectric material comprising $SiO_2$, $Si_3N_4$, SiON, $Al_2O_3$, $Ta_2O_5$, or HfO.

11. The method of claim 1 wherein the gate dielectric region includes a gate dielectric material comprising a high K dielectric material with its K value larger than 5.

12. A method for forming at least two semiconductor devices comprising:
   forming a gate dielectric region;
   determining that a first device formed on the gate dielectric region has a relatively faster gate dopant diffusion rate than a second device formed on the gate dielectric region;
   forming a doped gate electrode layer on the gate dielectric region, wherein forming the doped gate electrode layer includes doping the first and second devices with predetermined dopants in first and second device portions, respectively; and
   forming a step-structure in the doped gate electrode layer in which the first device portion has a thickness at least 10 angstroms larger than the second device portion, wherein the predetermined dopant for the first device has a relatively faster diffusion rate than the predetermined dopant for the second device.

13. The method of claim 12 wherein the forming a step-structure in the doped gate electrode layer includes:
   reducing the doped gate electrode layer to a first predetermined thickness;
   patterning a photoresist layer to cover the first device portion of the doped gate electrode layer;
   reducing the uncovered second device portion of the doped gate electrode layer to a second predetermined thickness; and
   removing the photoresist layer.

14. The method of claim 12 wherein the first device portion of the doped gate electrode layer having the relatively larger thickness, is less than 1500 angstroms in thickness.

15. The method of claim 14 wherein the first device portion of the doped gate electrode layer having the relatively larger thickness is less than 1100 angstroms in thickness.

16. The method of claim 12 further comprising metalizing the doped gate electrode layer.

17. A method for forming at least two semiconductor devices comprising:
   forming a gate dielectric region;
   determining whether a first and second device formed on the gate dielectric region have different gate conduction rates; and
   forming a doped gate electrode layer on the gate dielectric region, wherein forming the doped gate electrode layer includes doping with predetermined dopants in first and second device regions; and
   forming a step-structure in the doped gate electrode layer in which one of the first or second device regions has a thickness at least 20 angstroms larger than the other of the first or second device regions.

18. The method of claim 17 wherein the forming a step-structure in the gate electrode layer includes:
   forming the doped gate electrode layer to a first predetermined thickness;
   patterning a photoresist layer to cover the first or second device region of the doped gate electrode layer based on the difference of the gate conduction rates;
   forming a portion of the doped gate electrode layer to have a second predetermined thickness using the patterned photoresist layer; and
   removing the photoresist layer.

19. The method of claim 17 wherein the region of the doped gate electrode layer having the relatively larger thickness is less than 1500 angstroms in thickness.

20. The method of claim 17 further comprising metalizing the doped gate electrode layer.

21. The method of claim 17 wherein the doped gate electrode layer further includes a silicide containing gate material.

22. The method of claim 17 wherein the doped gate electrode layer further includes a doped-poly containing gate material.

* * * * *